(12) United States Patent
Castagna et al.

(10) Patent No.: US 9,070,533 B2
(45) Date of Patent: Jun. 30, 2015

(54) ENVIRONMENTAL SCANNING ELECTRON MICROSCOPE (ESEM/SEM) GAS INJECTION APPARATUS WITH ANODE INTEGRATED WITH GAS CONCENTRATING STRUCTURE

(71) Applicant: FEI Company, Hillsboro, OR (US)

(72) Inventors: Marc Castagna, Portland, OR (US); Clive D. Chandler, Portland, OR (US); Wayne Kurowski, Lake Oswego, OR (US); Daniel Woodrow Phifer, Jr., Eindhoven (NL)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 13/954,838

(22) Filed: Jul. 30, 2013

(65) Prior Publication Data
US 2014/0034830 A1    Feb. 6, 2014

Related U.S. Application Data

(60) Provisional application No. 61/677,226, filed on Jul. 30, 2012.

(51) Int. Cl.
*H01J 37/18* (2006.01)
*H01J 37/26* (2006.01)
*H01J 37/28* (2006.01)

(52) U.S. Cl.
CPC .............. *H01J 37/26* (2013.01); *H01J 37/18* (2013.01); *H01J 37/28* (2013.01); *H01J 2237/006* (2013.01)

(58) Field of Classification Search
CPC .................................. H01J 37/18; H01J 37/26
USPC ........................................................ 250/307
See application file for complete search history.

(56) References Cited

U.S. PATENT DOCUMENTS

| | | | |
|---|---|---|---|
| 4,785,182 A | | 11/1988 | Mancuso et al. |
| 5,149,974 A | * | 9/1992 | Kirch et al. ............... 250/492.2 |
| 5,500,528 A | * | 3/1996 | Matsui et al. ............... 250/310 |
| 5,591,970 A | * | 1/1997 | Komano et al. .............. 850/12 |
| 5,851,413 A | | 12/1998 | Casella et al. |

(Continued)

FOREIGN PATENT DOCUMENTS

| WO | WO9707525 | 2/1997 |
|---|---|---|
| WO | 2007051312 | 5/2007 |

OTHER PUBLICATIONS

Unknown, '3D Roughness Reconstruction,' obtained Aug. 6, 2012, 2 pgs.

*Primary Examiner* — Phillip A Johnston
*Assistant Examiner* — Sean Luck
(74) *Attorney, Agent, or Firm* — Scheinberg & Associates, PC; Michael O. Scheinberg; John E. Hillert (57) ABSTRACT

A gas injection system provides a local region at the sample surface that has sufficient gas concentration to be ionized by secondary electrons to neutralize charged on the sample surface. In some embodiments, a gas concentration structure concentrates the gas near the surface. An optional hole in the gas concentration structure allows the charged particle beam to impact the interior of a shrouded region. In some embodiments, an anode near the surface increases the number of ions that return to the work piece surface for charge neutralization, the anode in some embodiments being a part of the gas injection system and in some embodiments being a separate structure.

22 Claims, 4 Drawing Sheets

(56) References Cited

U.S. PATENT DOCUMENTS

| | | | |
|---|---|---|---|
| 6,182,605 B1 * | 2/2001 | Frosien | 118/723 EB |
| 6,365,898 B1 * | 4/2002 | Sudraud et al. | 250/310 |
| 6,683,320 B2 | 1/2004 | Gerlach et al. | |
| 6,753,538 B2 | 6/2004 | Musil et al. | |
| 6,838,380 B2 * | 1/2005 | Bassom et al. | 438/680 |
| 6,872,956 B2 * | 3/2005 | Gnauck et al. | 250/441.11 |
| 6,888,140 B2 | 5/2005 | Hayn | |
| 6,972,412 B2 | 12/2005 | Scholtz et al. | |
| 7,067,821 B2 | 6/2006 | Barnard et al. | |
| 7,205,237 B2 * | 4/2007 | Deering et al. | 438/690 |
| 7,425,708 B2 | 9/2008 | Slowko | |
| 7,435,973 B2 * | 10/2008 | Koops et al. | 250/441.11 |
| 7,462,839 B2 | 12/2008 | Gnauck et al. | |
| 7,541,580 B2 | 6/2009 | Knowles et al. | |
| 7,791,020 B2 | 9/2010 | Uncovsky et al. | |
| 7,893,397 B2 | 2/2011 | Phaneuf et al. | |
| 8,013,300 B2 | 9/2011 | Stern et al. | |
| 8,093,558 B2 | 1/2012 | Buijsse | |
| 8,153,966 B2 | 4/2012 | Arai et al. | |
| 8,303,833 B2 | 11/2012 | Toth et al. | |
| 8,466,415 B2 | 6/2013 | Phaneuf et al. | |
| 8,481,933 B2 | 7/2013 | Albiez et al. | |
| 8,552,406 B2 | 10/2013 | Phaneuf et al. | |
| 2002/0053638 A1 * | 5/2002 | Winkler et al. | 250/306 |
| 2005/0205800 A1 | 9/2005 | Barnard et al. | |
| 2005/0230620 A1 | 10/2005 | Jacka et al. | |
| 2008/0302954 A1 * | 12/2008 | Phaneuf et al. | 250/251 |
| 2008/0314871 A1 | 12/2008 | Toth et al. | |
| 2010/0102223 A1 | 4/2010 | Albiez et al. | |
| 2010/0108881 A1 | 5/2010 | Toth et al. | |
| 2011/0031394 A1 | 2/2011 | Knowles et al. | |
| 2011/0031655 A1 * | 2/2011 | Toth et al. | 264/400 |
| 2011/0204263 A1 | 8/2011 | Phaneuf et al. | |
| 2012/0091338 A1 * | 4/2012 | Buijsse | 250/307 |
| 2012/0112062 A1 * | 5/2012 | Novak et al. | 250/307 |

\* cited by examiner

ENVIRONMENTAL SCANNING ELECTRON MICROSCOPE (ESEM/SEM) GAS INJECTION APPARATUS WITH ANODE INTEGRATED WITH GAS CONCENTRATING STRUCTURE

This application claims priority from U.S. Provisional Pat. App. No. 61/677,226 filed Jul. 30, 2012, which is hereby incorporated by reference.

TECHNICAL FIELD OF THE INVENTION

The present invention relates to charged particle beam systems, and in particular, to charged particle beam systems that allow a work piece to be processed in a gaseous environment.

BACKGROUND OF THE INVENTION

In a scanning electron microscope ("SEM"), a primary beam of electrons is scanned upon a region of a sample that is to be investigated. The energy released in the impact of the electrons with the sample causes the liberation of other charged particles in the sample. The quantity and energy of these secondary particles provide information on the nature, structure and composition of the sample. The term "sample" is traditionally used to indicate any work piece being processed or observed in a charged particle beam system and the term as used herein includes any work piece and is not limited to a sample that is being used as a representative of a larger population. The term "secondary electrons" as used herein includes backscattered primary electrons, as well as electrons originating from the sample. To detect secondary electrons, a SEM is often provided with one or more secondary electron detectors.

In a conventional SEM, the sample is maintained in a high vacuum to prevent scattering of the primary electron beam by gas molecules and to permit collection of the secondary electrons. However, when the beam impinges on a non-conducting region of the sample, the sample tends to accumulate an electric charge, which can deflect the primary beam and affect the number of secondary electrons reaching a detector. The polarity of the accumulated charge depends on the type and energy of particles in the primary beam and on the work piece material. Although the electrons in the primary beam are negatively charged, each impinging primary electron may eject more than one secondary electron, leaving the sample positively charged. Several techniques have been proposed to reduce sample charging, including depositing a conductive layer onto the sample, directing low energy electrons toward the sample, as described in U.S. Pat. No. 6,683,320 to Gerlach et al. for "Through-the-lens neutralization for charged particle beam system," and directing light toward a semiconductor sample to induce photoconductivity to drain the charge.

Another solution is maintaining the sample under a relatively high pressure and is described, for example, in U.S. Pat. No. 4,785,182, to Mancuso et al., entitled "Secondary Electron Detector for Use in a Gaseous Atmosphere." Such devices are better known as High Pressure Scanning Electron Microscopes (HPSEM) or Environmental Scanning Electron Microscopes. An example is the Quanta 600 ESEM® high pressure SEM from FEI Company. Secondary electrons are accelerated toward an anode and ionize gas particles along the way, with the ionized gas particles being attracted back to the charged sample, away from the anode, and neutralizing the charge.

In an HPSEM, the sample that is to be investigated is placed in an atmosphere of a gas having a pressure typically between 0.1 Torr (0.13 mbar) and 50 Torr (65 mbar), and more typically between 1 Torr (1.3 mbar) and 30 Torr (40 mbar), whereas in a conventional SEM the sample is located in vacuum of substantially lower pressure, typically less than $10^{-5}$ Torr ($1.3 \times 10^{-5}$ mbar). Besides charge neutralization, an HPSEM offers the possibility of forming electron-optical images of moist samples, such as biological samples, and other samples that, under the high vacuum conditions in a conventional SEM, would be difficult to image. An HPSEM provides the possibility of maintaining the sample in its natural state; the sample is not subjected to the disadvantageous requirements of drying, freezing or vacuum coating, which are normally necessary in studies using conventional SEMs and which can alter the sample.

In an HPSEM, secondary electrons are typically detected using a process known as "gas ionization cascade amplification" or "gas cascade amplification," in which the secondary charged particles are accelerated by an electric field and collide with gas molecules in an imaging gas to create additional charged particles, which in turn collide with other gas molecules to produce still additional charged particles. This cascade continues until a greatly increased number of charged particles are detected as an electrical current at a detector anode. In some embodiments, each secondary electron from the sample surface generates, for example, more than 20, more than 100, or more than 1,000 additional electrons, depending upon the gas pressure and the electrode configuration. Gas cascade amplification detectors typically do not provide as high resolution or as great amplification as conventional, high vacuum detectors, such as an Everhart-Thornley detector, which uses a combination of a scintillator and a photomultiplier.

An HPSEM limits the region of high gas pressure to a sample chamber by using a pressure-limiting aperture (PLA) to maintain a high vacuum in the focusing column. Gas molecules scatter the primary electron beam, and so the pressure limiting aperture is positioned to minimize the distance that the primary electron beam travels in the high pressure region in order to reduce scattering of the primary beam, while providing a sufficient travel distance between the sample and the detector for adequate gas cascade amplification of the secondary electron signal.

An HPSEM as described in U.S. Pat. No. 4,785,182, comprises a vacuum envelope having a pressure limiting aperture, an electron beam source located within the vacuum envelope and capable of emitting electrons, one or more focusing lenses located within the vacuum envelope and capable of directing an electron beam emitted by the electron source through the pressure limiting aperture, beam deflectors located within the vacuum envelope and capable of scanning the electron beam, and a sample chamber including a sample platform disposed outside the high vacuum envelope and capable of maintaining a sample enveloped in a gas at a desired pressure.

Charged particle beams, such as electron beams or ion beams, can also be used to induce a chemical reaction to etch a sample or to deposit material onto a sample. Such processes are described, for example, in U.S. Pat. No. 6,753,538, to Musil et al. for "Electron Beam Processing." The process of a charged particle beam interacting with a process gas in the presence of a substrate to produce a chemical reaction is referred to as "beam chemistry."

US Pub. No. 2011/0031394, which is assigned to the assignees of the present application describes several configurations of environmental cells that allow HPSEM operation. The term "environmental cell" is used to mean an enclosure that contains the sample and provides an environment around the sample, typically a different environment than that present in a vacuum chamber in which the environmental cell is located. An environmental cell can solve some of the above problems by enhancing control of the sample environment, reducing the concentration of gaseous impurities present during HPSEM processing, and reducing the volume and inner surface area of the HPSEM process chamber. However, the environmental cell solutions are not fully compatible with a high vacuum SEM. Thus, there is a need for a method and system that provides an ESEM environment within a high vacuum SEM.

Other environmental cells are described in US Pub. No. 2012/0112062, and U.S. Pat. No. 8,093,558. Gas injection systems for use in a high vacuum SEM that include a shroud-type concentrator are described, for example, in U.S. Pat. No. 5,851,413.

SUMMARY OF THE INVENTION

An object of the invention is to provide a region of gas near the sample in a high vacuum SEM system to facilitate processing a sample without having to flood the whole chamber or cell with a gas.

In accordance with a preferred embodiment of the invention, a gas injection system (GIS) is provided that allows a portion of the sample surface to be processed in a gaseous environment. In one embodiment, the GIS comprises a needle to direct gas flow to the region of interest of a sample and a structure for concentrating the gas in the area impinged by the beam. In some embodiments, the structure includes an aperture to pass the electron beam. Ionization of the gas by the sample surface provides charged particles that are attracted to the sample to neutralize any charge build-up. In some embodiments, the needle or a portion of the structure is electrically biased relative to the sample to direct positively charged particle towards the sample and/or to act as a detector for secondary and/or backscattered electrons. When the needle is withdrawn from the sample, the system can operate as a conventional, high vacuum instrument. The gas concentrated by the structure can be a precursor gas that decomposes in the presence of the beam to etch or deposit the work piece.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Some embodiments of the present invention allow users to process insulating samples without charge accumulating on the work piece. Some embodiments of the invention are compatible with high vacuum scanning electron microscope by confining the gas to a small area at the sample surface and by being easily moved to away from the sample to allow conventional high vacuum microscope operation. Some embodiments of the invention allow imaging of the sample using gas cascade amplification of secondary electrons and allow moist samples to be processed in a low vacuum environment. Some embodiments of the invention neutralize charge on samples. Some embodiments also provide a gas injection system that can provide a precursor gas to a region near the beam impact point for processing a work piece. Some embodiments allow a user to form an image of a sample at high resolution in a high vacuum mode using, for example, a scintillator-photomultiplier detector, and then switch to lower resolution gas cascade amplification imaging.

In a conventional SEM, the electron beam impinging on insulating samples accumulates electric charge, which creates an electrical potential tending to deflect the electron beam from the scanned point. By providing a local high-pressure environment above the beam impact point, positive ions are formed near the sample surface due to collisions of the secondary electrons with gas atoms. These positive ions are attracted back towards the charged sample or can be directed toward the sample by an electric field. In some embodiments, the needle or a structure for concentrating or containing the gas in a local region near the beam impact point is electrically biased to act as an anode, which drives the positive ions to neutralize the sample.

Prior art, high vacuum gas injection systems typically inject gas in the direction of the sample surface from above the sample. The gas is rapidly dispersed in the vacuum chamber, and so these systems require a relatively high, constant flow of gas to maintain gas on the sample surface in vicinity of the beam impact point. Such systems do not supply a sufficient gas concentration for practical charged neutralization or gas cascade amplification. By providing a structure that concentrates the gas, a high concentration of ions can be generated locally to neutralize the charging of the sample. In prior art systems using a GIS needle, generated ions are typically dispersed away from the sample. Prior art systems that do concentrate the gas, such as U.S. Pat. No. 5,851,413, do not provide for charge neutralization or secondary electron detection.

Providing a biased anode near the gas delivery site increases ion yield and allows better charge control. Less gas may be required in some embodiments, because the gas that is present is more effectively ionized and delivered to charged regions of the sample. While neutral gas molecules are not attracted to the charging sections of the sample, ions "see" the potential difference and migrate to the area. Creating more ions near the high gas concentration will increase effectiveness of the charged neutralization. The use of an anode near the sample attracts low energy electrons and provides an energy gradient to cause an avalanche ionization of gas molecules in the local vicinity. Moreover, back scattered electrons and primary beam electrons also interact with the gas liberate low energy electrons from gas molecules. Attracted by the anode, these particles increase both electron and ion generation through avalanche or electron cascade type reaction. The presence of the electrically biased anode increases the probability of ionization for each gas molecule, thereby providing more ions to participate in sample neutralization. The anode allows for collecting the low energy electrons and produces an exponential increase in ion generation and neutralizing the charge, even for the higher current used in analytical currents). In some embodiments, a biasing voltage is applied to all or a portion of the shroud. As used herein, the term "shroud" refers to any structure, regardless of shape, that concentrates the gas at a region of the sample surface. In some embodiments, the biasing voltage is applied to a local anode that is not part of the GIS system. In some embodiments, the anode is separate from the GIS and may be positioned, for example, to the side of and above the sample. A "local" anode is one that is near the portion of the sample toward which the beam is directed. In some embodiments, the distance between the anode and the portion of the sample surface is less than 10 cm, less than 5 cm, less than 2 cm, or less than 1 cm. In some embodiments, the distance between the anode and the sample surface is less than ⅔, less than ½, or less than ¼ of the distance between the end of objective lens and the sample surface, In some embodiments, gas is delivered locally in smaller volumes than in the prior art. An electrical bias is supplied, preferably to an anode that is shaped to direct ions toward the area of interest.

Some embodiments of the invention use a structure to concentrate the gas near the beam impact point. In some embodiment, the gas-injection needle itself is shaped and positioned to concentrate the gas. In some embodiments, a gas concentrating or containing structure, such as a shroud, is attached to and supported by the needle to concentrate the gas. The structure, combined with the GIS needle, provides and contains a gas to provide ESEM imaging and/or processing conditions inside a high vacuum SEM. The structure allows the gas to be maintained in a local environment without disrupting the high-vacuum SEM. Embodiments of the invention provide the user the ability to image at high resolution in high vacuum modes and to operate in an ESEM environment for charge control or processing, simply by inserting the ESEM GIS.

The needle or other structure may include an aperture to pass the electron beam. The localized aspect of the gas concentration allows the generation of an ESEM-like environment at the beam impact point, without having to flood the whole chamber or cell with a high pressure gas. In one embodiment, a GIS needle with a "coaxial needle" type geometry for the tip of the needle directs the gas flow locally to the region of interest to concentrate the gas flow and improve charge neutralization and signal collection. The needle is preferably supported by on the vacuum chamber wall by a mechanism that electrically isolates the needle from the vacuum chamber wall so that the needle or a structure attached to the needle can be electrically charged. The needle then functions not only as the gas source, but as a driving force for the positive ions back to the sample and as an ESEM detector. The needle can be supported by a modified GIS mount that houses the gas handling hardware and the connections for the ESEM detector.

In prior art ESEM cells, the entire sample is positioned within the cell, and the entire work piece surface is exposed to the gas in the cell. In some embodiments of the present invention, the gas concentrating structure is positioned above a portion of the work piece surface so that only the portion of the work piece near or under the structure, the "shrouded region," is exposed to the high concentration of gas. In some embodiments, the bottom of the shroud is positioned close to or in contact with the work piece surface so that the gas conductance between the bottom of the shroud and the work piece is small, thereby providing a pressure differential of at least a factor of ten between the shrouded region and the work piece vacuum chamber away from the shroud. If a hole is provided for the electron beam, the hole is also sufficiently small to limit the gas conductance and maintain the pressure differential described above.

In some embodiments, the work piece is positioned on a work piece stage in the work piece vacuum chamber, and the area of gas concentration or the shrouded region is less than ½ the area of the sample stage. More preferably, the diameter of the gas concentration or shrouded region is less than ¼ or less than 1/10 the area of the stage. The gas concentration or shrouded region is preferably less than 3 mm$^2$, more preferably less than 2 mm$^2$ and even more preferably less than 1 mm$^2$.

In some embodiments, the ESEM GIS also functions as a detector for secondary electrons or to generate additional ions for charge neutralization. All or a portion of the gas concentrating structure or the needle can be charged to act as an anode to attract and detect secondary electrons. By concentrating a gas locally between the sample and the anode or detector electrode, improved detection is possible. Once the primary electron beam impinges on the sample, the liberated secondary electrons move toward the anode and collide with gas molecules in their path. These collisions result in the liberation of new electrons, commonly known as daughter electrons, which also move in the direction of the anode. These newly liberated electrons in turn will again collide with other gas molecules, such that gas amplification of the secondary electron signal occurs. The term secondary electron is used to include daughter electrons and reflected primary beam electrons.

The greater the distance that the secondary electrons travel to the anode, the greater number of collisions and the greater the amount of amplification. Some embodiments incorporate a magnetic field that causes the secondary electrons from the sample to follow a helical path on their way to the shroud. In this way, the distance traversed by the secondary electrons is increased, so that the collision probability and the amplification factor increase. The lens used to focus the primary beam may provide the magnetic field. As described in U.S. Pat. No. 6.972,412 to Scholtz, the electric field, the magnetic field, and the aperture may be configured to increase amplification using a magnetic Penning effect, a magnetron effect, or both to subject secondary and daughter electrons to axial oscillations, radial oscillation, or both, to increase the path length and increase the number of collisions and the gas amplification. Thus, the present invention provides the advantage of an ESEM environment with improved detection means and the ability to neutralize non-conductive samples while maintaining the high resolution of a high vacuum SEM.

Figure 1:
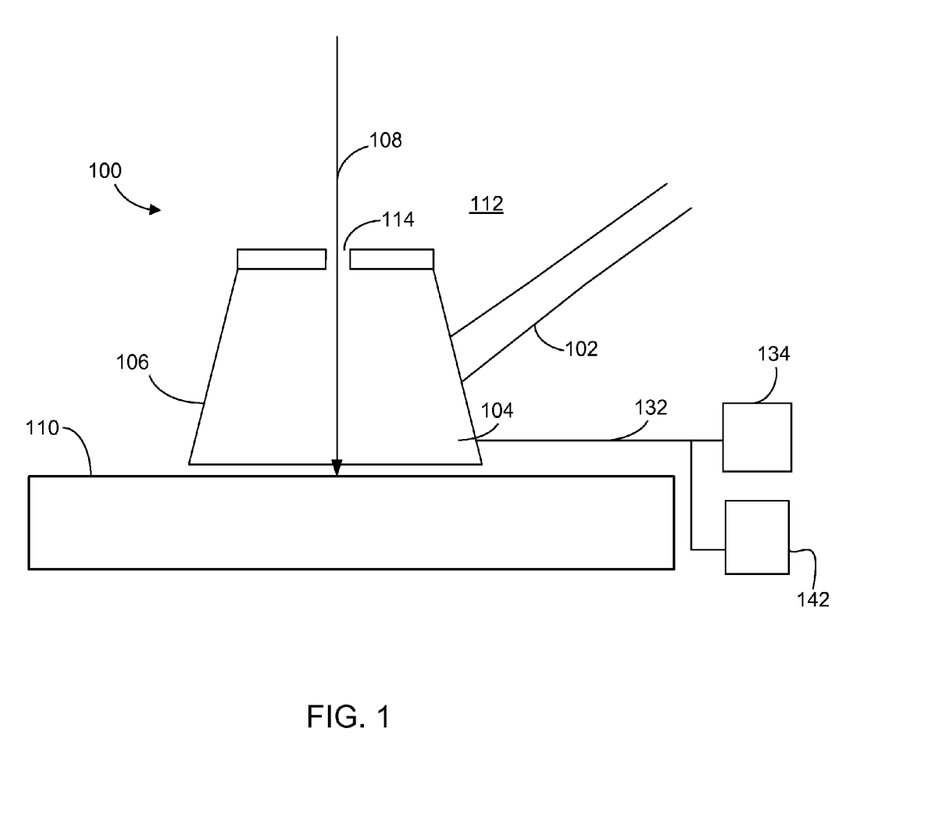
FIG. 1 shows a needle and shroud in accordance with an embodiment of the invention.

FIG. 1 shows a GIS 100, including a needle 102 for providing a gas into a shrouded region 104 within a gas concentrating structure, in this case, a shroud 106. Shroud 106 allows a gas to be concentrated in a shrouded region near the impact point of an electron beam 108, without exposing an entire sample 110 and the surrounding vacuum chamber 112 to a high concentration of gas. An aperture 114 in shroud 106 allows electron beam 108 to impact the sample 110. Aperture 114 is sufficiently large to pass the electron beam over the full scanning angle range, while being sufficiently small to limit the gas conductance from the shrouded region 104 to the rest of vacuum chamber 112 of the SEM. The portion of the shroud that defines the aperture is preferably sufficiently thick to withstand erosion by the ion beam. Preferably, the shroud 106 is placed sufficiently close to the sample that the gas conductance between the bottom of the shroud and the sample is small. In some embodiments, the shroud can touch the sample surface. Concentrating the gas within the shrouded region 104 provides for adequate interaction between secondary electrons and the gas to create ions for charge neutralization and daughter electrons for imaging, while reducing the gas pressure in the rest of the vacuum chamber.

Because the conductance from the shrouded region to the vacuum chamber is low, the gas flow required to maintain a relatively high pressure in shrouded area 104 is low. To maintain a pressure in the sample vacuum chamber between $1 \times 10^{-5}$ and $1 \times 10^{-7}$ mbar, the pressure in the shroud is preferably less than $1 \times 10^{-4}$ mbar, more preferably less than $1 \times 10^{-3}$ mbar and most preferably less than $1 \times 10^{-2}$ mbar. In a prior art GIS in a high vacuum SEM, a typical gas pressure in the sample chamber is between $1 \times 10^{-5}$ mbar and $1 \times 10^{-6}$ mbar when the GIS are in operation. Needle 102 is preferably connected to a gas source outside the sample chamber. The needle can be selectively connected to multiple gas sources to provide different gases to the area within the shroud. For charge neutralization and imaging, preferred gases include, water, Nitrous oxide, ammonia, and oxygen. The gas is preferably easily ionized and provides good signal amplification by the collision cascade. For deposition or etching, a suitable precursor gas can be chosen, depending on the work piece material and the processing desired.

Shroud 106 is preferably connected via a conductor 132 to a voltage source 134. The voltage source 134 allows the shroud to be biased to a desired voltage such that the shroud acts as an anode. When biased, the shroud acts as an anode and drives the positive ions resulting from collisions between electrons and gas atoms down toward the sample surface, thereby neutralizing the sample charge. In some embodiments, the entire shroud is conductive and biased. In other embodiments, only a portion of the shroud is biased. The shroud is typically biased to between 10 V and 10,000 V, depending on the gas used and the composition of the sample. Skilled persons can readily determine an appropriate bias voltage by observing the charge on the sample. In certain embodiments, shroud 106 also acts as a detector for secondary electrons. When the shroud is biased to act as an anode, the difference in electrical potential between the shroud 106 and the sample 110 accelerates secondary electrons emitted from the sample 110 toward the shroud. The secondary ions collide with gas molecules, which in turn are ionized to free additional electrons, which accelerate and ionize more gas molecules, thereby amplifying the secondary electron signal by way of a collision cascade. Shroud 106 is connected to an imaging controller 142 through conductor 132, resulting in the detection of the secondary electron signal. Applicants have thus discovered a novel system that combines gas injection and ESEM detection.

Figure 2:
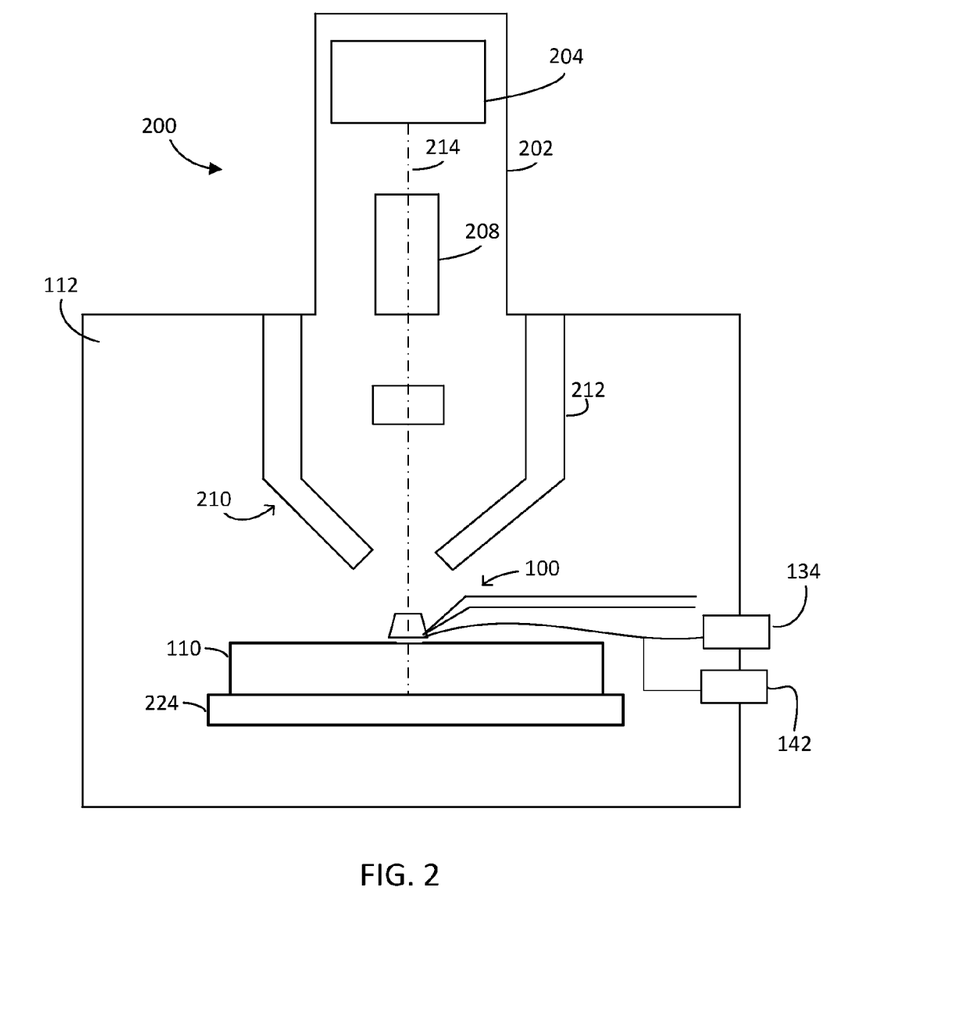
FIG. 2 shows a charged particle beam system that includes the needle and shroud of FIG. 1.

FIG. 2 shows the GIS 100 of FIG. 1 positioned in a charged particle beam system 200 that includes a charged particle beam column 202 comprising a charged particle beam source 204, deflectors 208 and an objective lens 210 including pole piece 212, all aligned on an optical axis 214. Sample chamber 112 includes a sample motion stage 224 that has at least a first translation or rotation axis and a second translation or rotation axis relative to the optical axis.

Figure 3:
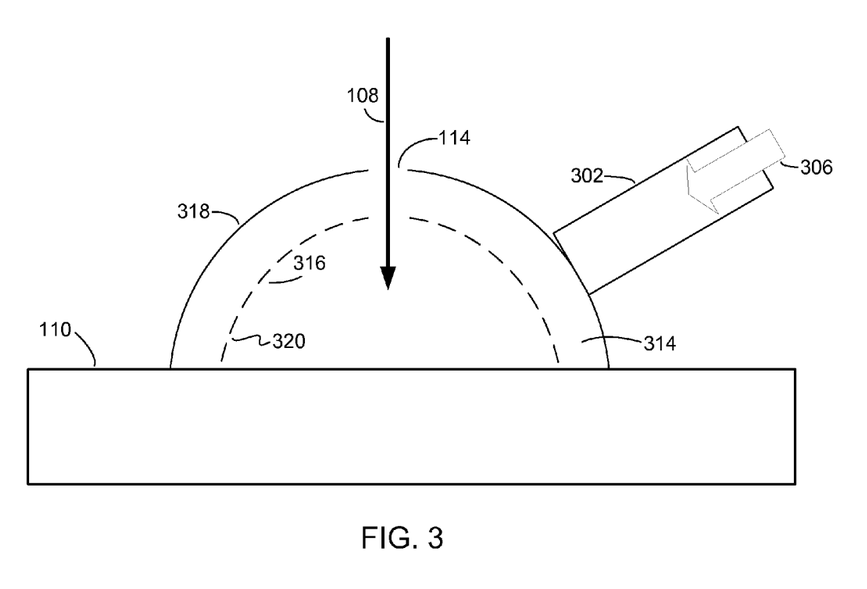
FIG. 3 shows another embodiment of the invention with a semi-spherical needle structure.

FIG. 3 shows another embodiment in which the needle itself provides containment of the gas above the sample. The needle 302 connects to a hollow semi-spherical structure 314 composed of an inner shell 316 concentric with outer shell 318. Gas 306 flows in through needle 302 and then throughout the semi-spherical structure 314 to deliver the gas to the sample through small perforations 320. The semi-spherical structure 314 is biased to allow for charge neutralization of the sample.

Figure 4:
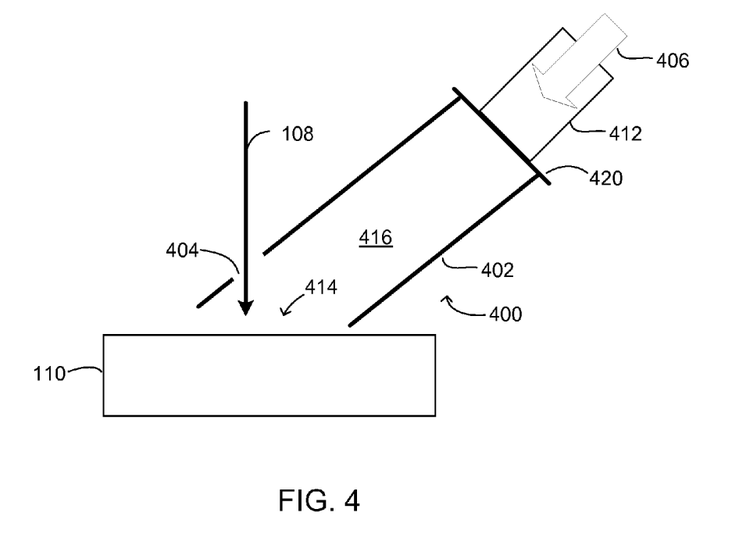
FIG. 4 shows an embodiment in which a gas injection needle encloses the sample surface without a separate shroud.

FIG. 4 shows another embodiment of a GIS 400, in which a gas injection needle 402 without a separate shroud is configured to provide a high concentration of gas at the surface of sample 110. Electron beam 108 passes through an aperture 404 in the needle 402, which is in contact or close proximity to the sample 110. Gas 406 enters the needle through conduit 412. The needle 402 encloses a shrouded region 414 of the sample surface to which the beam 108 is directed. The shape of the needle provides the gas concentration, limiting the gas conductance form the gas amplification region 416 to support the gas ionization and charge neutralization. In this embodiment, the end of needle 402 is tapered, preferably so that the end of the needle is parallel to the sample surface to reduce the gas conductance to vacuum chamber 122 (FIG. 2) from a gas amplification region 408 in the interior of needle 402. In some embodiments, the needle 402 can touch the surface of the work piece 110 to provide a conductive path to drain electrical charge away from the impact point of the electron beam, while the gas neutralizes charge at the impact point and the region immediately around the impact point. An anode 420 positioned at the end of gas amplification region 416 attracts secondary electrons through the interior region of needle 402, providing a relatively long path length for gas amplification. Anode 420 is electrically biased, whereas needle 402 is not, so as to draw secondary electrons up the tube to be collected on 420. Needle 420 may be composed of an electrically insulating material or, if it is conductive, it is electrically isolated from anode 420. Gas amplification region 416 has sufficient length, for example, 2 mm, to provide a sufficient gas cascade to adequately amplify the secondary electron signal. Needle 402 can be electrically insulated from anode 420.

Figure 5:
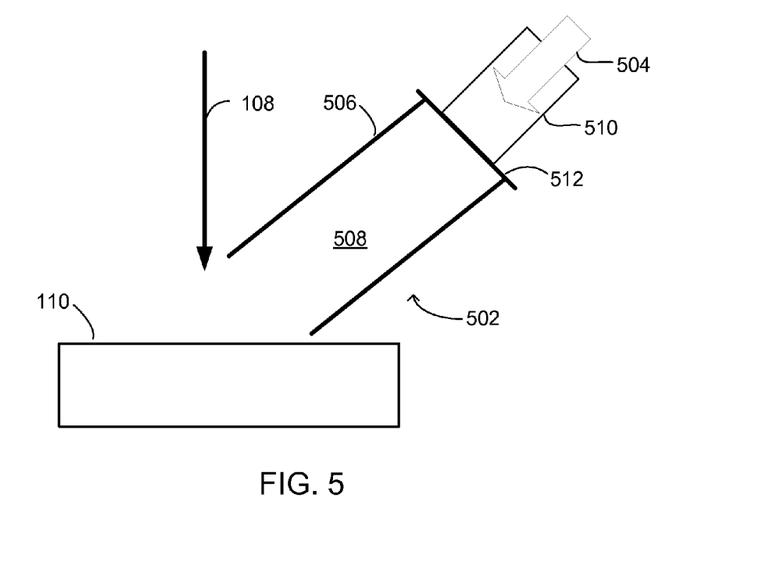
FIG. 5 shows another embodiment in which the needle provides additional path length.

FIG. 5 shows another embodiment of a gas GIS 502 having a needle 506, similar to needle 402 of FIG. 4, but having reduced gas containment because the end of needle 506 is not tapered to be parallel to the sample surface. Gas 504 enters a needle 506 through a conduit 510, the needle 506 providing a long gas amplification region 508 for gas cascade amplification between sample 110 and an anode 512, which is electrically biased to draw secondary electrons up the tube.

Figure 6:
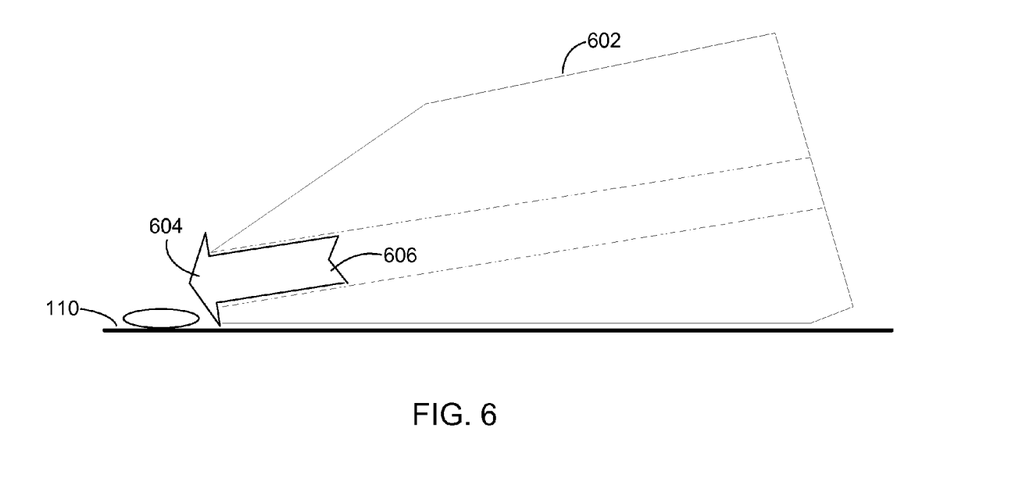
FIG. 6 shows an embodiment in which a gas injection needle is configured without a separate shroud and does not enclose the sample.

In another embodiment, as shown in FIG. 6, a gas injection needle 602 is configured without a separate shroud and does not enclose the sample. The needle has an opening 604 of about 60 microns and the bottom of the needle is ground at an angle of 15 degrees to the longitudinal axis of the needle. A flat may be ground in the top of the needle to provide a reference angle in relation to the angle at the bottom of the needle, so that an operator can tell when the bottom of the needle end is parallel to the work piece surface. The proximity of the opening 604 to the sample surface near the beam impact point provides a high local concentration of gas. The embodiment of FIG. 6 requires a greater gas flow 606 than previous embodiments because the gas is not contained and is constantly being dissipated.

While the embodiments above described the use of the invention for charge neutralization on a non-conductive work piece, embodiments of the invention can be used in any application in which the presence of a gas at the sample is desired, such as for viewing moist sample, such as biological material, or for being induced deposition or etching.

The invention has multiple inventive aspects and broad applicability, and can provide many benefits as described and shown in the examples above. The embodiments will vary greatly depending upon the specific application, and not every embodiment will provide all of the benefits and meet all of the objectives that are achievable by the invention. Some of the claims, as attached hereto or as amended during prosecution, may cover less than all the embodiments of the invention described.

Although the present invention and its advantages have been described in detail, it should be understood that various changes, substitutions and alterations can be made to the embodiments described herein without departing from the spirit and scope of the invention as defined by the appended claims. For example, while the embodiments above described the use of an electron beam, other embodiments can use an electron beam or an ion beam. While the embodiments above use a gas conduit that is inside a hollow shroud support, the gas conduit could be outside the shroud support. Similarly, the electrical contacts for biasing the shroud and/or for detecting the amplified secondary particle current can be through the shroud support itself, or through a separate conductor.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An apparatus for providing a gas at a work piece surface in a vacuum chamber, comprising:
    a gas concentration structure for concentrating a gas at a shrouded region of the work piece, the gas concentration structure having an aperture for passing a beam to the work piece, the shrouded region being less than an entirety of the work piece, the aperture being sufficiently small to limit a conductance of the gas through the aperture;
    a gas concentration structure support member for supporting the gas concentration structure, the gas concentration structure support member being moveable to position the gas concentration structure to concentrate the gas near a region of interest on the work piece; and
    a gas conduit for providing the gas to a space within the gas concentration structure,
    wherein the gas concentration structure comprises an anode configured to:
        cause an ionization of the concentrated gas;
        drive positive ions generated by the ionization towards the work piece surface; and
        detect a secondary electron signal amplified by the ionization.

2. The apparatus of claim 1 in which the conduit comprises a hollow within the gas concentration structure.

3. The apparatus of claim 1 in which the gas concentration structure support member comprises a gas concentration structure support member drive mechanism that provides for motion along a longitudinal axis to withdraw the gas concentration structure from the work piece when not in use.

4. The apparatus of claim 1 further comprising a circuit for detecting electrons impinging on the anode, the electrons comprising a detector signal.

5. The apparatus of claim 1 in which a shape of the gas concentration structure comprises a portion of a cone, a portion of a sphere, or at least a portion of a cylinder.

6. The apparatus of claim 1 in which at least a portion of the gas concentration structure is hollow and communicates to the gas conduit for conducting gas from the conduit toward the work piece.

7. A charged particle beam system, comprising:
    a source of charged particles;
    a work piece vacuum chamber;
    a focusing lens for focusing the charged particles from the source of charged particles onto a work piece in the work piece vacuum chamber; and
    an apparatus in accordance with claim 1 for providing a gas at a sample surface in the work piece vacuum chamber.

8. The charged particle beam system of claim 7 in which the source of charged particles comprises a source of electrons.

9. The charged particle beam system of claim 7 in which the shroud is adapted to be positioned above the surface of the work piece to provide a region of limited gas flow between the shroud and the surface of the work piece to maintain a higher pressure within the shroud.

10. The charged particle beam system of claim 7 further comprising a sample stage having a stage diameter, a portion of the shroud adapted to be closest to the work piece having a shroud diameter corresponding to the diameter of the shrouded region of the work piece, the shroud diameter being less than half the stage diameter.

11. A method of operating a charged particle beam system to process a work piece in a sample vacuum chamber, comprising:
    creating a region inside the vacuum chamber between a portion of a work piece surface and a as concentration structure having a first gas concentration higher than a second gas concentration elsewhere in a sample vacuum chamber, the portion of the work piece being smaller than an entire surface of the work piece and the gas concentration structure comprising an anode;
    directing a charged particle beam toward the work piece, the charged particle beam passing through the first gas concentration;
    applying a voltage to the anode such that the anode attracts secondary electrons generated from an impact of the charged particle beam, the secondary electrons causing an ionization cascade in the first gas concentration;
    neutralizing an electrical charge on a portion of the workpiece with positive ions from the ionization cascade; and
    detecting an electron current amplified by the ionization cascade using the anode to form an image.

12. The method of claim 11 in which the gas concentration structure comprises a shroud, the shroud having an aperture to pass the charged particle beam.

13. The method of claim 11 in which neutralizing an electrical charge on a portion of the workpiece with positive ions from the ionization cascade comprises neutralizing an electrical charge on a non-conductive portion of the work piece using an ionized gas.

14. The method of claim 12 in which the shroud is positioned above the portion of the work piece such that gas flow between the shroud and the work piece is sufficiently small to maintain a pressure differential of at least a factor of 10 between an inside of the shroud and the sample vacuum chamber away from the work piece.

15. The method of claim 14 in which the shroud contacts the work piece.

16. The method of claim 14 in which the shroud is positioned less than 0.5 mm above the work piece to limit a gas conductance from inside the shrouded area to the rest of the sample vacuum chamber.

17. An apparatus for providing a concentration of a gas at a work piece surface in a vacuum chamber, comprising:
   a gas concentrator comprising an anode and configured to provide a concentration of a gas at a portion of a work piece surface, the portion less than the entire work piece surface, in a vacuum chamber; and
   a gas conduit for providing the gas to the gas concentrator, wherein the anode is configured to:
      cause an ionization of the concentration of the gas;
      drive positive ions generated by the ionization towards the work piece surface; and
      detect a secondary electron signal amplified by the ionization.

18. The apparatus of claim 17 in which the gas concentrator includes a shroud having an aperture through which to pass a charged particle beam.

19. The apparatus of claim 17 in which the gas concentrator does not include a shroud.

20. The apparatus of claim 1 in which the gas concentration structure comprises a gas injection needle.

21. The method of claim 11 in which the gas concentration structure comprises a gas injection needle.

22. The apparatus of claim 17 in which the gas concentrator comprises a gas injection needle.

* * * * *